US010714515B2

(12) United States Patent
Shinohara

(10) Patent No.: US 10,714,515 B2
(45) Date of Patent: Jul. 14, 2020

(54) SOLID-STATE IMAGE SENSING APPARATUS, ELECTRONIC DEVICE, AND TRANSPORTATION EQUIPMENT

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 16/221,763

(22) Filed: Dec. 17, 2018

(65) Prior Publication Data

US 2019/0198541 A1 Jun. 27, 2019

(30) Foreign Application Priority Data

Dec. 22, 2017 (JP) ................. 2017-246402

(51) Int. Cl.
*H04N 5/369* (2011.01)
*H01L 27/146* (2006.01)

(52) U.S. Cl.
CPC .... *H01L 27/14609* (2013.01); *H01L 27/1462* (2013.01); *H01L 27/1463* (2013.01); *H01L 27/1464* (2013.01); *H01L 27/14629* (2013.01); *H01L 27/14649* (2013.01); *H04N 5/369* (2013.01); *H01L 27/14627* (2013.01)

(58) Field of Classification Search
CPC .............. H04N 5/369; H01L 27/14609; H01L 27/1462; H01L 27/14629; H01L 27/1463; H01L 27/1464; H01L 27/14649; H01L 27/14627

USPC ......... 348/294–325, 340; 257/291, 292, 228, 257/447, 460, 443, 449, 294, 432, 304; 250/208.1; 438/69, 72, 29, 636, 952; 430/5

See application file for complete search history.

(56) References Cited

U.S. PATENT DOCUMENTS

| 8,587,040 B2 * | 11/2013 | Kobayashi | ............ H01L 31/062 257/291 |
| 8,970,769 B2 | 3/2015 | Shinohara et al. | |
| 2005/0122417 A1 * | 6/2005 | Suzuki | .......................... 348/294 |

(Continued)

FOREIGN PATENT DOCUMENTS

| JP | 2006-261372 A | 9/2006 |
| JP | 2014-154755 A | 8/2014 |

(Continued)

*Primary Examiner* — Marly S Camargo
(74) *Attorney, Agent, or Firm* — Venable LLP

(57) ABSTRACT

An image sensing apparatus is provided. The apparatus comprises pixels each including a photoelectric conversion element arranged in a semiconductor layer which has a first surface and a second surface and a wiring layer arranged below the first surface. Each of the pixels includes a first reflection film arranged below the first surface, an interlayer film arranged so as to cover the second surface, a second reflection film arranged inside the interlayer film and a microlens which is arranged above the interlayer film. An aperture is arranged in a portion, of the second reflection film, which overlaps the photoelectric conversion element. An area of the aperture is smaller than an area of the photoelectric conversion element, and each of the pixels further includes a deflecting portion configured to deflect light between the aperture and the second surface.

20 Claims, 6 Drawing Sheets

(56) References Cited

U.S. PATENT DOCUMENTS

| | | | |
|---|---|---|---|
| 2009/0039340 A1* | 2/2009 | Toda | H01L 31/0312 250/216 |
| 2014/0118602 A1* | 5/2014 | Shinohara | H01L 27/146 348/340 |
| 2015/0048468 A1 | 2/2015 | Iijima | |
| 2017/0229503 A1 | 8/2017 | Suzuki et al. | |
| 2019/0137331 A1* | 5/2019 | Hosaka | H01L 27/14634 250/338.1 |
| 2019/0244992 A1* | 8/2019 | Yokogawa | H01L 27/14612 257/292 |

FOREIGN PATENT DOCUMENTS

| | | |
|---|---|---|
| JP | 2015-037120 A | 2/2015 |
| JP | 2016-082133 A | 5/2016 |

\* cited by examiner

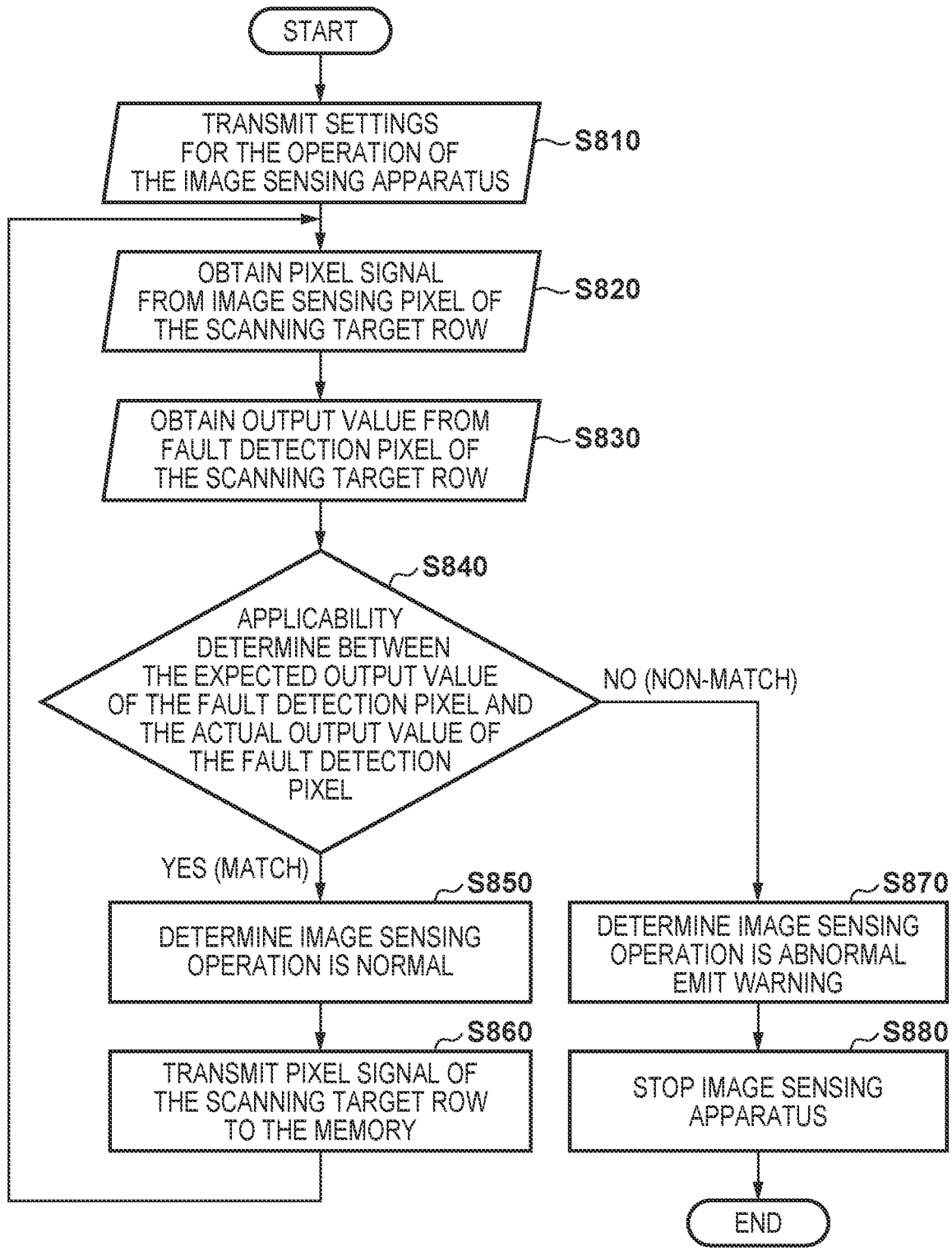

SOLID-STATE IMAGE SENSING APPARATUS, ELECTRONIC DEVICE, AND TRANSPORTATION EQUIPMENT

BACKGROUND OF THE INVENTION

Field of the Invention

The present invention relates to a solid-state image sensing apparatus, an electronic device, and a transportation equipment.

Description of the Related Art

As a solid-state image sensing apparatus, there is a back-side illumination solid-state image sensing apparatus (to be referred to as a BSI) that performs photoelectric conversion by performing light illumination from the back surface of a substrate which is on the opposite side of the front surface on which electrodes, wiring, and the like of the substrate are arranged. In order to photoelectrically convert incident light efficiently, Japanese Patent Laid-Open No. 2006-261372 discloses an arrangement in which the sensitivity is increased by substantially doubling the thickness of a semiconductor layer that absorbs light by arranging a reflection film for reflecting light on the side of the front surface of the substrate and using the incident light and the reflected light for photoelectric conversion. The arrangement of the reflection film allows high internal quantum efficiency to be obtained for red light with long wavelength.

SUMMARY OF THE INVENTION

The structure of Japanese Patent Laid-Open No. 2006-261372 is insufficient for detecting near-infrared rays/infrared rays.

An aspect of the embodiment of the present invention provides a technique of suppressing an increase in noise while improving, in particular, the internal quantum efficiency of the photoelectric conversion of near-infrared rays/infrared rays in a solid-state image sensing apparatus.

According to some embodiments, a solid-state image sensing apparatus comprising: a plurality of pixels each including a photoelectric conversion element arranged in a semiconductor layer which has a first surface and a second surface on a side opposite to the first surface; and a wiring layer arranged below the first surface, wherein each of the plurality of pixels includes a first reflection film arranged below the first surface, an interlayer film arranged so as to cover the second surface, a second reflection film arranged inside the interlayer film so as to cover the second surface, and a microlens which is arranged above the interlayer film in correspondence with the photoelectric conversion element, an aperture portion is arranged in a portion, of the second reflection film, which overlaps the photoelectric conversion element in an orthographic projection with respect to the second surface, the photoelectric conversion element includes a charge accumulation portion configured to accumulate charges generated in accordance with incident light, an area of the aperture portion is smaller than an area of the photoelectric conversion element in the orthographic projection with respect to the second surface, and each of the plurality of pixels further includes a deflecting portion configured to deflect light between the aperture portion and the second surface, is provided.

Further features of the present invention will become apparent from the following description of exemplary embodiments (with reference to the attached drawings).

BRIEF DESCRIPTION OF THE DRAWINGS

FIG. 7 is a flowchart showing an example of an operation of an image sensing system shown in FIGS. 6A and 6B.

DESCRIPTION OF THE EMBODIMENTS

Figure 1:
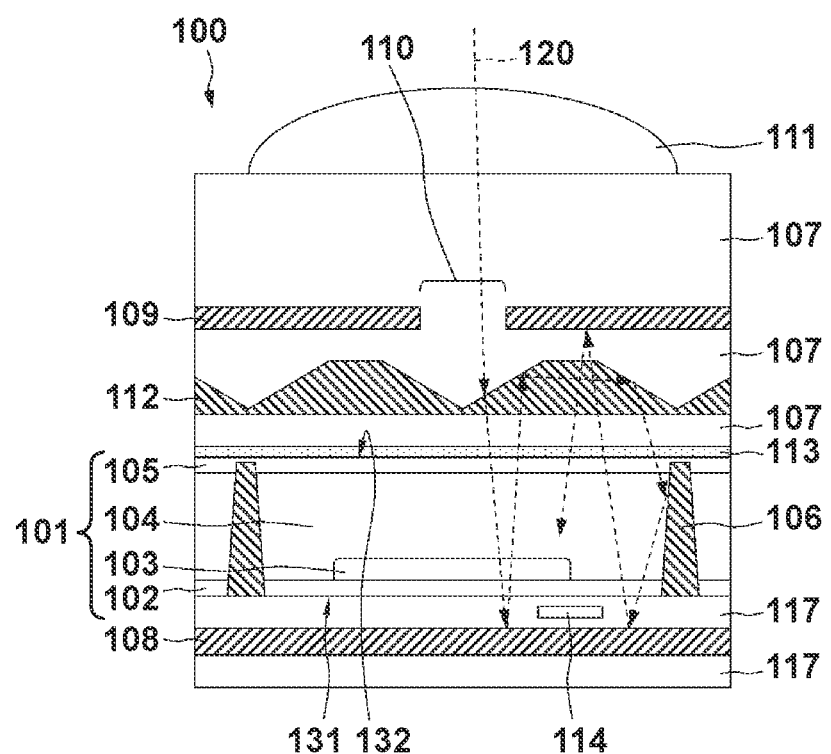
FIG. 1 is a sectional view showing an example of the arrangement of a pixel of a solid-state image sensing apparatus according to an embodiment of the present invention.

An embodiment of a solid-state image sensing apparatus according to the present invention will be described in detail below with reference to the accompanying drawings. Note that in the following description and drawings, common reference numerals denote common components throughout a plurality of drawings. Hence, common components will be described by cross-reference to the plurality of drawings, and a description of components denoted by common reference numerals will be omitted appropriately.

The structure of the solid-state image sensing apparatus according the embodiment of the present invention will be described with reference to FIGS. 1 to 4. In the description of this specification, assume that the signal carriers of respective pixels of the solid-state image sensing apparatus are electrons, and that the conductivity type of a charge accumulation portion for accumulating signal charges is the n-type. However, the embodiment will hold even in a case in which the arrangement of electrons and holes, and the arrangement of the p-type and the n-type of the conductivity types are reversed.

Figure 2:
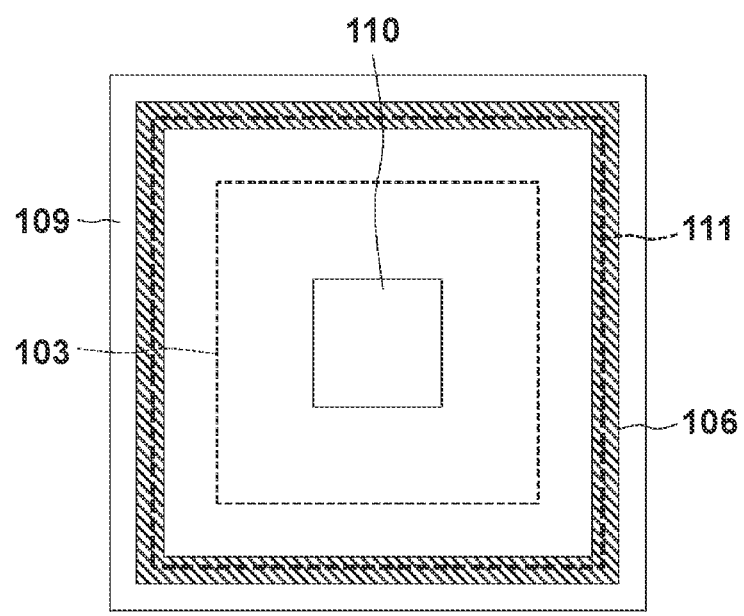
FIG. 2 is a plan view showing an example of the arrangement of the pixel of the solid-state image sensing apparatus of FIG. 1.

FIG. 1 is a sectional view showing the structure of a solid-state image sensing apparatus 100 according to the embodiment of the present invention. FIG. 2 is a plan view seen from a direction in which light enters the solid-state image sensing apparatus 100. The solid-state image sensing apparatus 100 is, as shown in FIG. 1, a back-side illumination (B SI) solid-state image sensing apparatus arranged with a plurality of pixels that allow light to enter from a back surface 132 (second surface) on the opposite side of a front surface 131 (first surface) on which a switch element and a wiring layer 114 for outputting signal charges generated by the incident light are arranged. In this specification, the upper side of FIG. 1 where the light enters will be referred to as "upper" or "above" and the lower side of FIG. 1 will be referred to as "lower" or "below".

Each of the pixels includes a heavily doped p-type diffusion layer 102 on the side of the front surface 131, an n-type diffusion layer 103 that functions as a charge accumulation portion which accumulates signal charges, and a heavily doped p-type diffusion layer 105 on the side of the back surface 132 in an n-type well 104 of a semiconductor layer 101. The semiconductor layer 101 can function as a photoelectric conversion element that generates charges corresponding to the incident light. Each of the plurality of pixels also includes, on the side of the front surface 131, the wiring layer 114 which is arranged below the front surface 131, a reflection film 108 which is arranged below the front surface 131 so as to cover the front surface 131, and an interlayer film 117. Each of the plurality of pixels also includes, on the side of the back surface 132, an interlayer film 107 which is arranged above the back surface 132 so as to cover the back surface 132 and a reflection film 109 which is arranged inside the interlayer film 107 so as to cover the back surface 132. In addition, each of the plurality of pixels includes a microlens 111 which is arranged above the interlayer film 107 in correspondence with the photoelectric conversion element. There is also between the plurality of pixels, an element isolation portion 106 in which a dielectric material is buried in the semiconductor layer 101. Furthermore, each of the plurality of pixels includes a high refractive index film 112 that functions as a deflecting portion that deflects light between an aperture portion 110 and the back surface 132 of the semiconductor layer 101. The deflecting portion will be described later.

The reflection films 108 and 109 are arranged to improve the quantum efficiency of long wavelength light, such as near-infrared light that has long transmission length through the semiconductor layer, by reflecting the light that entered the semiconductor layer 101, and by confining the incident light within the semiconductor layer 101. Also, in order to allow light to enter the semiconductor layer 101, the reflection film 109 has the aperture portion 110 of which orthographic projection to the back surface 132 overlaps the photoelectric conversion element. The microlens 111 is arranged so as to focus the light that enters each pixel to the aperture portion 110. Here, as shown in FIGS. 1 and 2, in an orthographic projection to the back surface 132 of the semiconductor layer 101, the area of the aperture portion 110 is smaller than the area of the semiconductor layer 101 that forms the photoelectric conversion element in each pixel and can also be smaller than the area of the n-type diffusion layer 103 that serves as the charge accumulation portion. Furthermore, the projected area of the aperture portion 110 may be smaller than the area of the microlens 111 which can be in a one-to-one correspondence with the photoelectric conversion element. Even in a case in which the aperture portion 110 has a small area, the reduction in the internal quantum efficiency can be prevented since the incident light will focus to the aperture portion 110 by the microlens 111 arranged in correspondence with the photoelectric conversion element of each pixel. Also, by making the area of the aperture portion 110 smaller, more rays of light traveling from the semiconductor layer 101 toward the direction of the microlens 111 can be reflected by the reflection film 109. The area of the photoelectric conversion element will be described hereinafter. In each of the pixels, a first active region for forming the photoelectric conversion element and a second active region for forming a transistor region which includes an amplification transistor and a transfer transistor for transferring charges from the photoelectric conversion element to the amplification transistor may be provided. In this case, the area of the photoelectric conversion element can be the area of the first active region for forming the photoelectric conversion element. Also, in a case in which an element isolation region (typically formed by a LOCOS method, an STI method, a DTI method, or the like) for separating the first active region and the second active region is to be arranged, an area including the first active region which is surrounded by the element isolation region can be set as the area of the photoelectric conversion element.

The boundary portion of each pixel may be defined by the element isolation portion 106. As shown in the plan view of Fig .2, the boundary portion of each pixel may be defined by the outer edge of the microlens 111 in an orthographic projection with respect to the back surface 132 of the semiconductor layer 101. Here, in an orthographic projection with respect to the back surface 132 of the semiconductor layer 101, the area of the aperture portion 110 may be equal to or less than 40% of the area of each pixel.

The semiconductor layer 101 is made of silicon in this embodiment. However, the material to be used for the semiconductor layer 101 is not limited to silicon, and another semiconductor material such as germanium or the like may be used. An insulating material made of silicon oxide or an insulating material whose main component is silicon oxide may be used as the material for the interlayer films 107 and 117. A metal such as aluminum, tungsten, copper, or an alloy made of these metals may be used for the reflection films 108 and 109. A DTI (Deep Trench Isolation) structure in which an insulator (dielectric material) such as silicon oxide is buried in a deep trench can be used for the element isolation portion 106 as shown in FIG. 1. An anti-reflection layer 113 made of silicon nitride may be arranged between the back surface 132 and the interlayer film 107 as shown in FIG. 1.

The high refractive index film 112 that functions as a deflecting portion will be described next. The high refractive index film 112 is made of a material with a higher refractive index than the material of the interlayer film 107. If the interlayer film 107 is made of silicon oxide, polysilicon or silicon nitride whose refractive index is higher than that of silicon oxide can be used for the high refractive index film 112. The high refractive index film 112 has a cavity in a region that overlaps the aperture portion 110 in an orthographic projection to the back surface 132 of the semiconductor layer 101. This cavity of the high refractive index film 112 deflects light by functioning as a concave lens that has a negative power. As shown in FIG. 1, the cavity may have a cone shape or a concave lens shape. As shown in FIG. 1, the high refractive index film 112 also has a cavity that overlaps the element isolation portion 106 in an orthographic projection to the back surface 132. As exemplified by a locus shown in FIG. 1, incident light 120 is repetitively reflected and refracted by the reflection films 108 and 109 and the high refractive index film 112, and is confined in the semiconductor layer 101.

More specifically, the reflection films 108 and 109 confine the light rays from above and below, and the element isolation portion 106 prevents the light from traveling to adjacent pixels in the semiconductor layer 101. If the high refractive index film 112 having a concave lens effect was not arranged, the ratio of rays, of the incident light 120, which have been reflected by the reflection film 108 and will exit the semiconductor layer 101 through the aperture portion 110 again would increase. However, the cavity, of which orthographic projection to the back surface 132 overlaps the aperture, could deflect the light traveling from the semiconductor layer 101 to the aperture portion 110. As a result, it is possible to reduce the ratio of the rays that will exit from the aperture portion 110. Because the cavity overlapping the aperture portion 110 tends to refract the light to travel to the direction (lateral direction in FIG. 1) where adjacent pixels exist in the high refractive index film 112. The structure that can refract the lateral light into the pixel is required. Thus, the high refractive index film 112 has, as shown in FIG. 1, a cavity in each region that overlaps the element isolation portion 106 in an orthographic projection to the back surface 132 of the semiconductor layer 101. Each cavity provided in the high refractive index film 112 has the effect of refracting the reflected light from the side of the front surface 131 to the pixel to which the light has re-entered.

In a back-side illumination image sensing apparatus, for example, in the case of a structure disclosed in Japanese Patent Laid-Open No. 2006-261372, according to trial calculation by the inventor, if the thickness of the semiconductor is 3 it can be estimated that the internal quantum efficiency of a near-infrared ray having a wavelength of 900 nm will be about 19%. In a case using a front-side illumination image sensing apparatus, although it is possible to obtain a high quantum efficiency with respect to near-infrared rays and infrared rays by setting the thickness of the semiconductor layer to 10 µm or more, dark current noise will increase due to the increase in dark currents by the increased thickness of the semiconductor layer.

Meanwhile, this embodiment can implement a solid-state image sensing apparatus with high sensitivity, that is, a solid-state image sensing apparatus that has high internal quantum efficiency, with respect to near-infrared light whose depth of transmission through the semiconductor layer 101 is several tens of microns, and has little loss caused by the re-exiting of light from the aperture portion 110. Also, it is possible to reduce the occurrence of crosstalk between the pixels since the element isolation portion 106 can reduce the leakage of light to each adjacent pixel and confine the light in the pixel. Furthermore, since the light can be confined in the pixel even if it has a large transmission length through the semiconductor layer 101, there is no need to increase the thickness of the semiconductor layer 101. In this manner, the solid-state image sensing apparatus 100 according to this embodiment can implement an image sensor with little crosstalk and has a high quantum efficiency, that is, sensitivity with respect to near-infrared light without accompanying an increase in dark current noise.

In this embodiment, the high refractive index film 112 has a cavity on the side in which the microlens 111 through which light enters is arranged. However, the arrangement in not limited to this, and the cavity may be arranged on the side of the semiconductor layer 101. Also, although this embodiment deflects light by using a material that has a higher refractive index than the material of the interlayer film 107 to form the deflecting portion, a material that has a lower refractive index than the material of the interlayer film 107 may be used. In this case, the same effect as that described above can be obtained by arranging a convex-shaped portion in each region that overlaps the back surface 132 and causing it to function as a concave lens.

As shown in FIG. 1, an intra-layer lens or a waveguide for efficiently collecting light may be arranged between the aperture portion 110 and the microlens 111, in other words, in a region of the interlayer film 107 which is on the side where the microlens 111 is arranged than the reflection film 109, for example, in the interlayer film 107 between the microlens 111 and the aperture portion 110.

In the element isolation portion 106, in order to suppress the crosstalk between pixels, a dielectric material is buried in a deep trench formed on the side of the front surface 131 of the semiconductor layer 101. For example, the trench depth might be equal to or more than 80% of the thickness of the semiconductor layer 101 in a direction perpendicular to the surface from the front surface 131. Also, as shown in FIG. 1, the dielectric material may be buried from the front surface 131 of the semiconductor layer 101 to the heavily doped p-type diffusion layer 105 that is a p-type layer of the opposite conductivity type to the n-type diffusion layer 103 serving as the charge accumulation portion. The crosstalk between pixels can be reduced by forming the element isolation portion 106 in a portion near the back surface 132 of the semiconductor layer 101.

Although there is only one layer of the wiring layer 114 shown in the arrangement shown in FIG. 1, a plurality of wiring layers may be arranged in the solid-state image sensing apparatus 100. In this case, each wiring layer may be arranged in the interlayer film 117 between the reflection film 108 and the front surface 131 of the semiconductor layer 101 or may be arranged in the interlayer film 117 on the opposite side of the semiconductor layer 101 with respect to the reflection film 108. The wiring layer 114 may also function as a layer for reflecting the incident light in the same manner as the reflection film 108.

Figure 3:
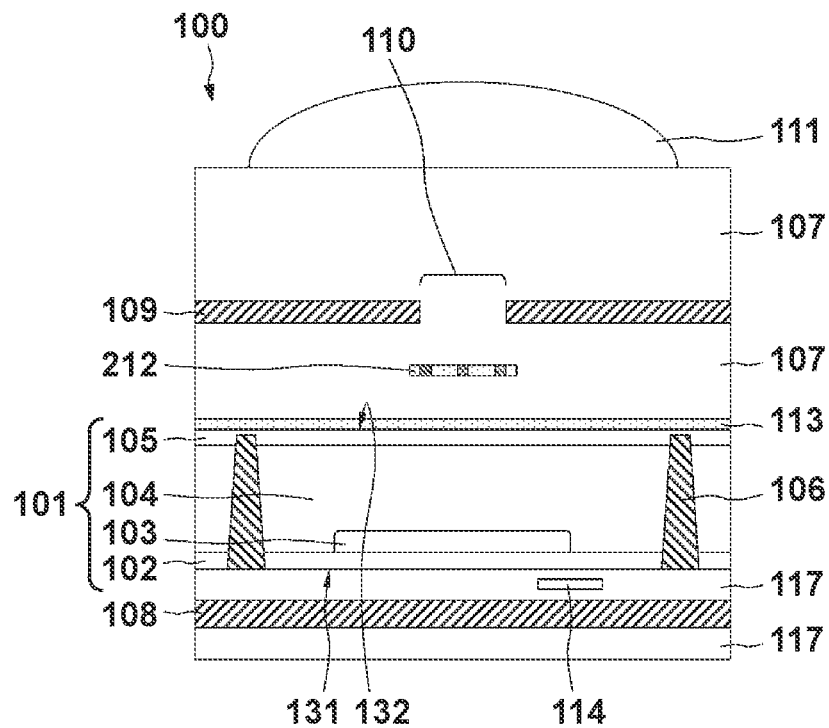
FIG. 3 is a sectional view showing a modification of the pixel of the solid-state image sensing apparatus of FIG. 1.

In addition, the deflecting portion do not need to be limited to the concave lens made of high refractive index film 112. For example, as shown in FIG. 3, a diffraction grating 212, which is formed from a material with a higher refractive index than the material of the interlayer film 107, may be arranged as the deflecting portion in a region that overlaps the aperture portion 110 in an orthographic projection to the back surface 132. The diffraction grating 212 can be made of a material such as silicon nitride, polysilicon, or the like. Light traveling from the semiconductor layer 101 to the aperture portion 110 is diffracted (deflected) by t the diffraction grating 212, thereby reducing the ratio of light exiting from the aperture portion 110. For example, polysilicon cubes, in which each side of a cube has a length of 200 nm to 300 nm, are arranged in a planar checkerboard manner at an interval of 1.8 µtm. As a result, near-infrared light with wavelength of 900 nm that passes through the diffraction grating 212 will have, for example, a diffraction angle of 30°.

Since the diffraction ratio of the light that passes through the diffraction grating 212 is about several tens of percent, the loss due to light exiting through the aperture portion 110 to outside of the solid-state image sensing apparatus 100 may become comparatively larger than that in the case of concave lens made of the high refractive index film 112 as shown in FIG. 1. However, in addition to the fact that the diffraction grating 212 can be formed by only patterning silicon nitride or polysilicon, its thickness can also be made smaller than that of the high refractive index film 112. Thus, the space between the reflection film 109 and the semiconductor layer 101 becomes narrow (thin), and the ratio of light reflected by the reflection film 109 mixing into each adjacent pixel can be suppressed. Hence, a structure or an element which has the same function as a region with the concaved high refractive index film 112 need not be arranged in each region that overlaps the element isolation portion 106 in an orthographic projection with respect to the back surface 132 as described above. For example, a deflecting portion such as the diffraction grating 212 or the like need not be arranged in each region that overlaps the element isolation portion 106 in an orthographic projection with respect to the back surface 132. In this case, the diffraction grating 212 may be a grating which has a non-periodical structure instead of the periodical structure as that described above. The effect of deflecting light and suppressing the leakage of light from the aperture portion 110 can be obtained even when a non-periodical grating is adopted.

As described above, the solid-state image sensing apparatus 100 with high sensitivity to near-infrared light, low crosstalk, and small dark current noise can be implemented even in a case in which the diffraction grating 212 is arranged as a deflecting portion between the aperture portion 110 and the back surface 132. In addition, since the diffraction grating 212 can be implemented by a comparatively simpler manufacturing process than the case in which the high refractive index film 112 is used as the deflecting portion, it is possible to reduce the manufacturing cost of the solid-state image sensing apparatus 100.

Also, although the above description showed a case in which a metal is used to form the reflection film 108, the reflection film 108 need not be limited to being made of a metal. In the arrangement shown in FIG. 4, the reflection film 108 has a stacked layer structure that includes a layer formed by an interlayer film 117' in contact with the front surface 131 and a reflection layer 317 which is in contact with a surface on the opposite side of the surface in contact with the front surface 131 of the layer formed by the interlayer film 117'. A material such as silicon nitride, polysilicon, or the like that has a higher refractive index than the silicon oxide used for the interlayer films 107 and 117' can be used for the reflection layer 317.

Here, assume that d1 (nm) is the thickness and n1 is the refractive index of the interlayer film 117' between the semiconductor layer 101 and the reflection layer 317, and that d2 (nm) is the film thickness and n2 is the refractive index of the reflection layer 317. Assume also that λ (nm) is the wavelength of the detection target (of interest) light in vacuum. In this case, by setting $d1=\lambda/(4 \cdot n1)$ and $d2=\lambda/(4 \cdot n2)$, for the light that enters the side of the semiconductor layer 101, the reflection film 108 will have a large reflection ratio with respect to the detection target light. More specifically, in a case in which the semiconductor layer 101 is silicon, the interlayer film 117' is made of silicon oxide, the reflection layer 317 is made of polysilicon, and the wavelength of the detection target light is 900 nm, n1=1.45 and n2=3.63. In this case, when it is assumed that d1=155 nm and d2=62 nm, the reflection ratio of the reflection film 108 with respect to the detection target light having the wavelength of 900 nm is 84%. The light absorption inside the reflection layer 317 (polysilicon) in one reflection can almost be ignored because of its small thickness.

Figure 4:
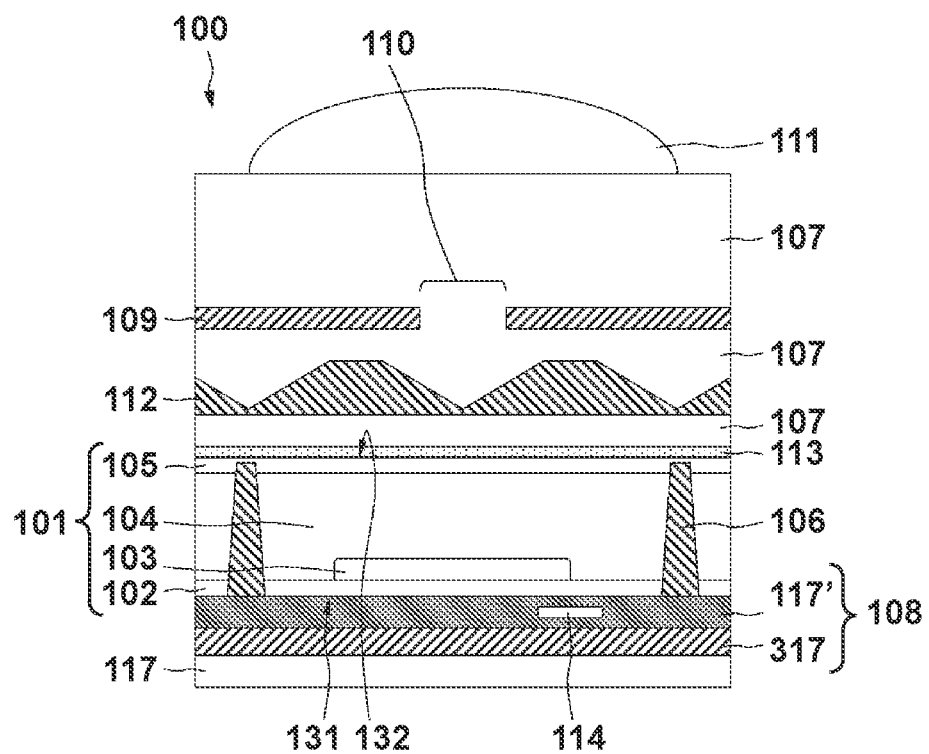
FIG. 4 is a sectional view showing a modification of the pixel of the solid-state image sensing apparatus of FIG. 1.

In a case in which a metal is used for the reflection film 108, a layer to prevent the diffusion of metal atoms in the semiconductor layer 101 is typically arranged as an anti-diffusion layer on the semiconductor (101) side of the metal (reflection film 108) in the semiconductor manufacturing process for manufacturing the solid-state image sensing apparatus 100. This is because if metal atoms diffuse and contaminate the semiconductor layer 101, it may lead to a defect generating big dark current or the like. Since a material other than a metal is frequently used for the anti-diffusion layer, the light reflection ratio may decrease in some cases. Meanwhile, if an anti-diffusion layer is not arranged for the reflection film 108 made of a metal in order to acquire a high light reflection ratio, the characteristic of the solid-state image sensing apparatus 100 may degrade due to the occurrence of a lot of defect or the like. Hence, as shown in FIG. 4, this concern for metal contamination can be suppressed by using a non-metal material to form the reflection film 108 instead of a metal reflection film.

In this manner, by forming the reflection film 108 on the side of the front surface 131 of the semiconductor layer 101 by using a non-metal material, an image sensing element with high sensitivity towards near-infrared light, low crosstalk, and small dark current noise can be implemented without increasing defects or the like that causes the performance degradation of the solid-state image sensing apparatus. To form the reflection film 109 on the side of the back surface 132 of the semiconductor layer 101, the process to form the side of the back surface 132 can employ a so-called post-processing low-temperature process. Hence, the possibility of metal contamination by the reflection film 109 on the side of the back surface 132 is lower than that of the reflection film 108 on the side of the front surface 131. Therefore, in consideration of the process of arranging the aperture portion 110, the reflection film 109 may be formed by using a metal material or the like in the above-described manner. Furthermore, although the arrangement shown in FIG. 4 showed an example in which the high refractive index film 112 as shown in FIG. 1 is used as a deflecting portion, it may use the diffraction grating 212 as shown in FIG. 2.

As application examples of the solid-state image sensing apparatus 100 according to the above-described embodiment, an electronic device such as a camera or a smartphone incorporating the solid-state image sensing apparatus 100 and a transportation equipment such as an automobile will be exemplified hereinafter. Here, the concept of a camera includes not only an apparatus whose main purpose is image sensing but also an apparatus (for example, a personal computer, a mobile terminal such as a tablet, etc.) that auxiliarly has an image sensing function.

Figure 5:
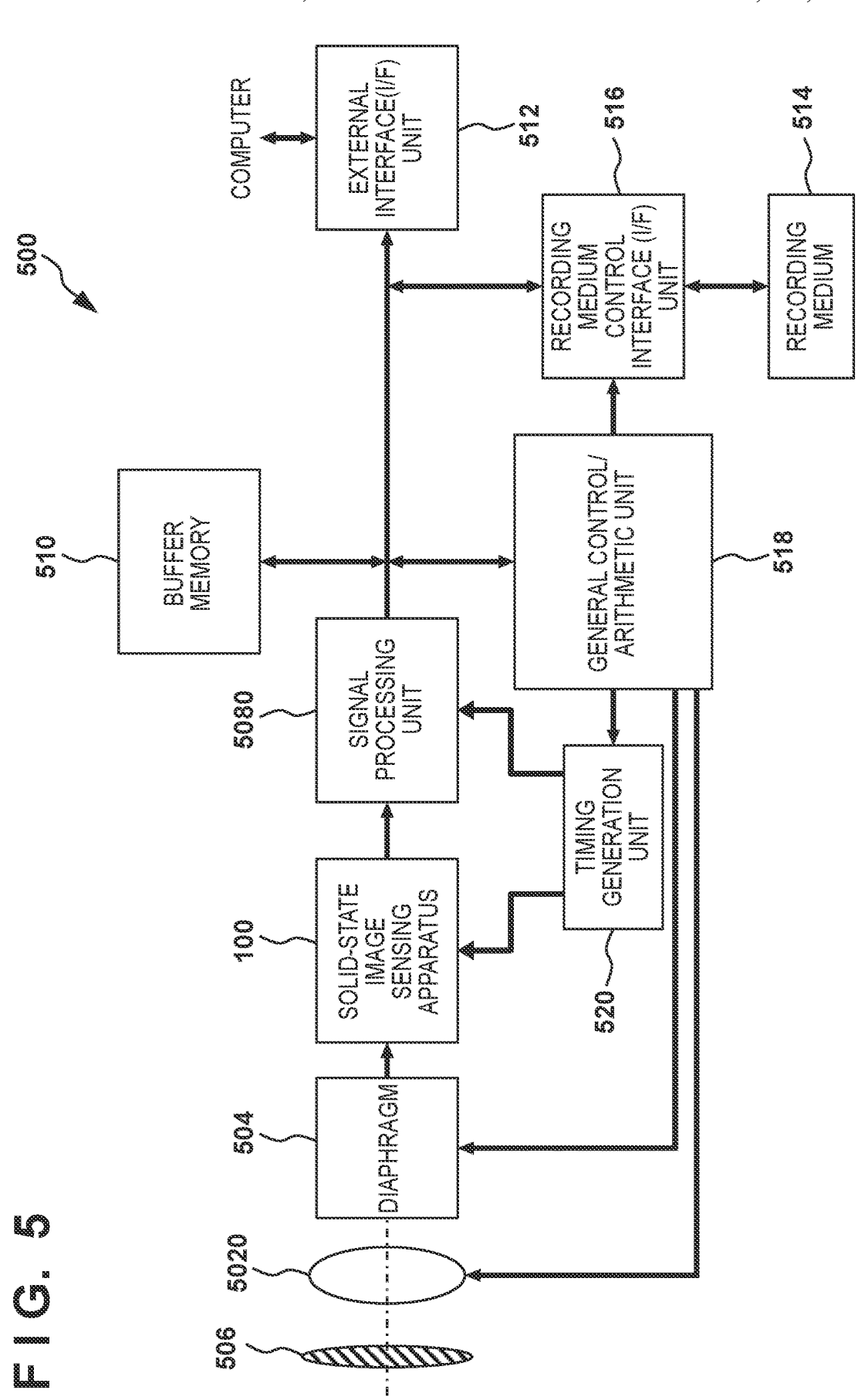
FIG. 5 is a block diagram showing an example of a camera that includes an image sensing system in which the solid-state image sensing apparatus of FIG. 1 has been incorporated.

FIG. 5 is a block diagram showing the arrangement of an image sensing system 500 according to this embodiment. The image sensing system 500 according to this embodiment includes one of the arrangements of the solid-state image sensing apparatus 100 described above. A digital still camera, a digital camcorder, a monitoring camera, and the like are specific examples of the image sensing system 500. FIG. 5 shows an example of the arrangement of a digital still camera that uses the above-described solid-state image sensing apparatus 100.

The image sensing system 500 exemplified in FIG. 5 includes the solid-state image sensing apparatus 100, a lens 5020 for forming an optical image of an object in the solid-state image sensing apparatus 100, a diaphragm 504 for changing the amount of light that passes through the lens 5020, and a barrier 506 for protecting the lens 5020. The lens 5020 and the diaphragm 504 form an optical system for focusing light to the solid-state image sensing apparatus 100.

The image sensing system 500 includes a signal processing unit 5080 for performing the processes on output signals from the solid-state image sensing apparatus 100. The signal processing unit 5080 performs a signal processing operation of performing various kinds of corrections and compression on the input signal as needed and outputting the processed signal. The signal processing unit 5080 may also have a function of performing AD-conversion processing on each output signal from the solid-state image sensing apparatus 100. In this case, an AD conversion circuit need not be included in the solid-state image sensing apparatus 100.

The image sensing system 500 also includes a buffer memory 510 for temporarily storing image data and an external interface unit (external I/F unit) 512 for communicating with an external computer or the like. The image sensing system 500 also includes a recording medium 514 such as a semiconductor memory for recording or reading out the image sensing data and a recording medium control interface unit (recording medium control I/F unit) 516 for causing the recording medium 514 to record or read out the image sensing data. Note that the storage medium 514 may be incorporated in the image sensing system 500 and may be detachable.

The image sensing system 500 further includes a general control/arithmetic unit 518 that performs various kinds of arithmetic operations and controls the overall digital still camera and a timing generation unit 520 that outputs various kinds of timing signals to the solid-state image sensing apparatus 100 and the signal processing unit 5080. The timing signal or the like may be input from the outside, and the image sensing system 500 suffices to include at least the solid-state image sensing apparatus 100 and the signal processing unit 5080 for processing the output signals from the solid-state image sensing apparatus 100. The general control/arithmetic unit 518 and the timing generation unit 520 may be arranged to perform some or all of the control functions of the solid-state image sensing apparatus 100.

The solid-state image sensing apparatus 100 outputs an image signal to the signal processing unit 5080. The signal processing unit 5080 performs predetermined signal processing on the image signal output from the solid-state image sensing apparatus 100 and outputs image data. The signal processing unit 5080 also generates an image by using the image signal.

An image sensing system which is capable of obtaining a better quality image can be implemented by forming an image sensing system by using the solid-state image sensing apparatus 100 described above.

Figure 6A:
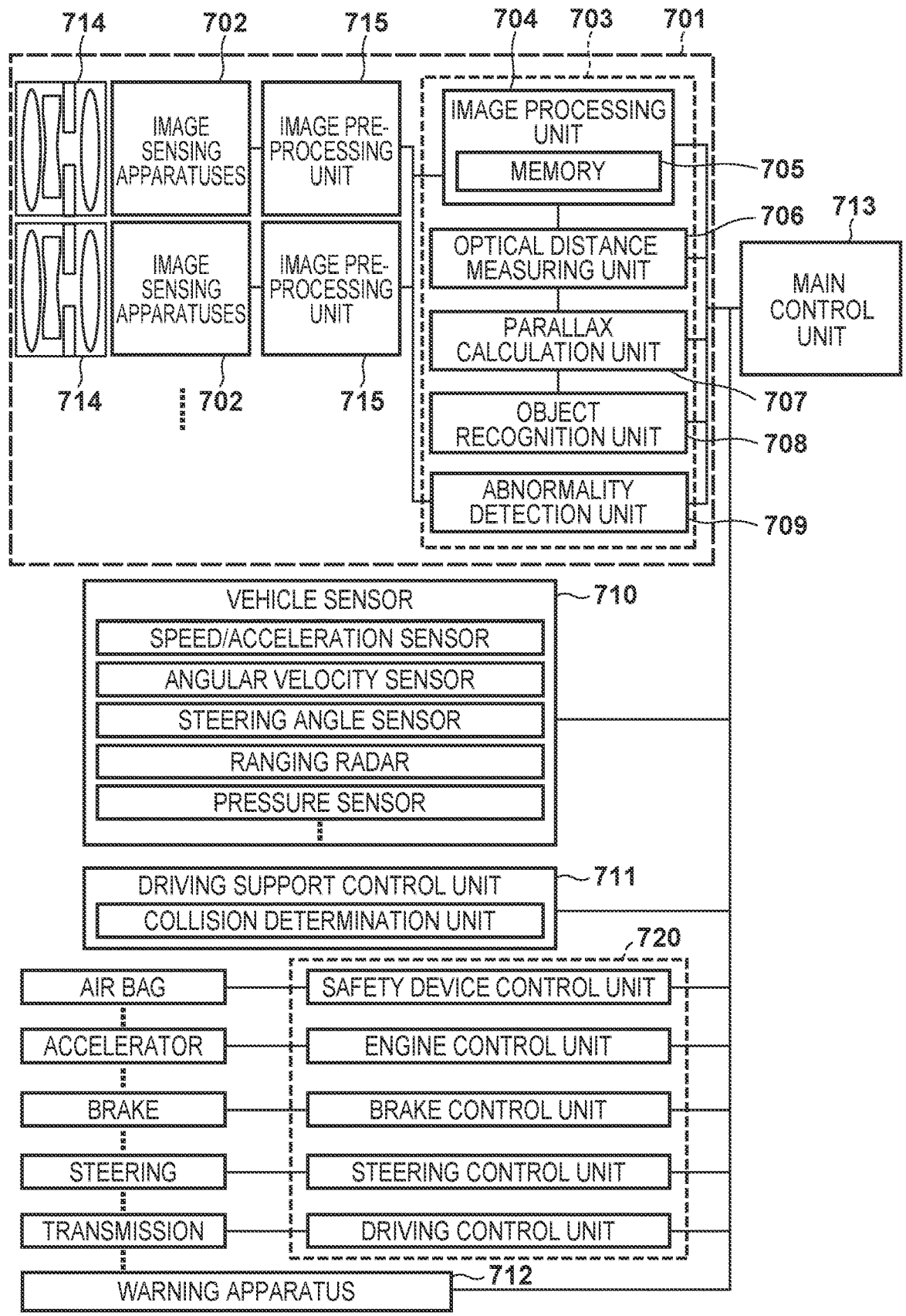
FIGS. 6A and 6B are views each showing an example of the arrangement of an automobile that includes the image sensing system in which the solid-state image sensing apparatus of FIG. 1 has been incorporated.
Figure 6B:
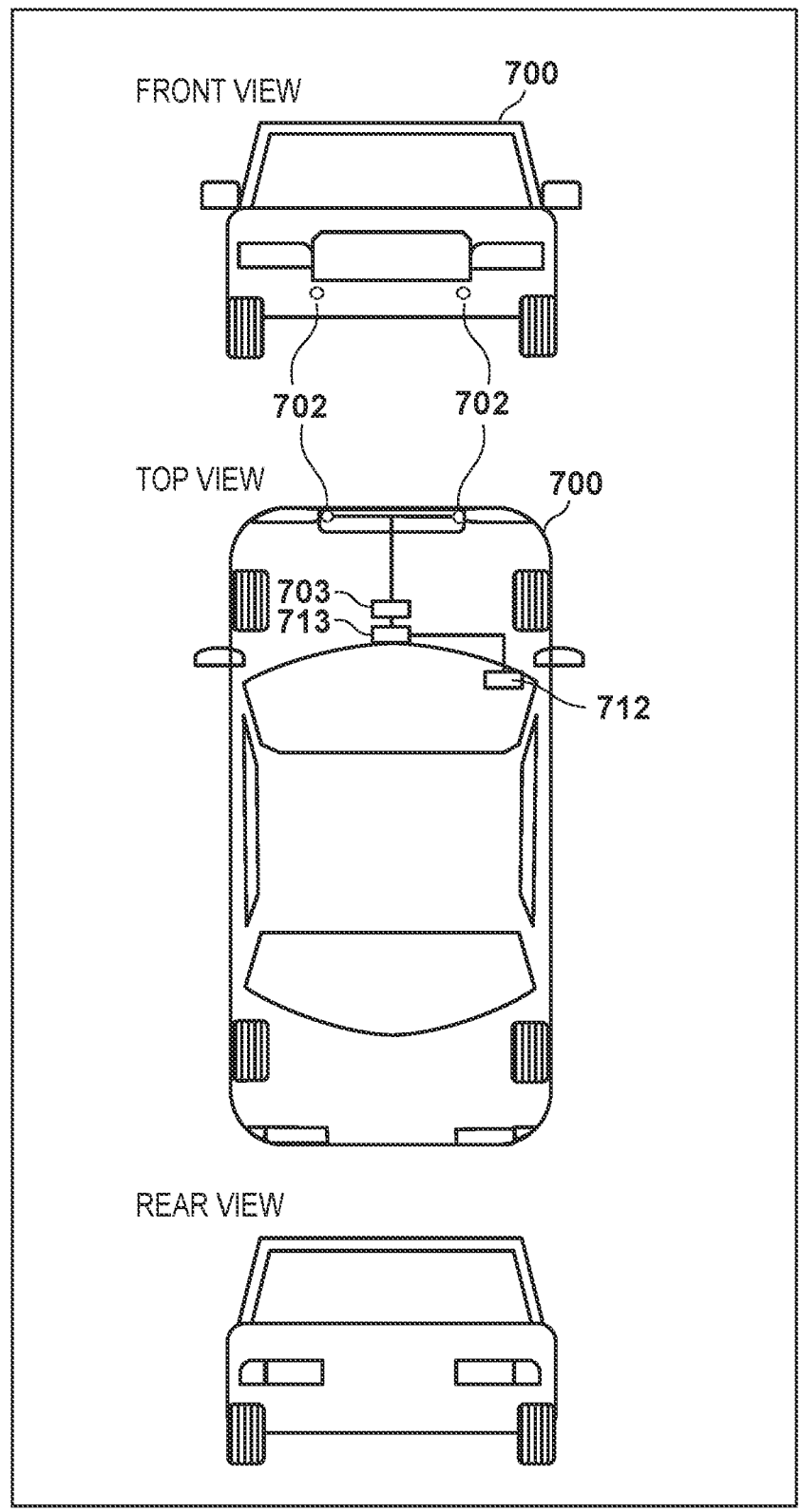

A camera incorporating the solid-state image sensing apparatus 100 is applicable as a monitoring camera, an onboard camera mounted in a transportation equipment such as an automobile or a railroad car, or the like. A case in which the camera incorporating the solid-state image sensing apparatus 100 is applied to a transportation equipment will be exemplified here. A transportation equipment 700 is, for example, an automobile including an image sensing system 701 (onboard camera) shown in FIGS. 6A and 6B. FIGS. 6A and 6B schematically show the main arrangement examples of the image sensing system 701 and the transportation equipment 700, respectively. FIG. 7 is a flowchart showing the operation of the image sensing system 701.

The image sensing system 701 includes image sensing apparatuses 702, image pre-processing units 715, an integrated circuit 703, and optical systems 714. Each optical system 714 forms an optical image of an object in the corresponding image sensing apparatus 702. Each image sensing apparatus 702 converts the optical image of the object that has been formed by the corresponding optical system 714 into an electrical signal. The image sensing apparatus 702 is the solid-state image sensing apparatus 100 described above. Each image pre-processing unit 715 performs predetermined signal processing on a signal output from the corresponding image sensing apparatus 702. The functions of the image pre-processing unit 715 may be incorporated in the image sensing apparatus 702. At least two sets of the optical system 714, the image sensing apparatus 702, and the image pre-processing units 715 are arranged in the image sensing system 701, and an output from the image pre-processing unit 715 of each set is input to the integrated circuit 703.

The integrated circuit 703 is an image sensing system application specific integrated circuit and includes an image processing unit 704 including a memory 705, an optical distance measuring unit 706, a parallax calculation unit 707, an object recognition unit 708, and an abnormality detection unit 709. The image processing unit 704 performs image processing such as a development process, defect correction, and the like on an output signal from each image pre-processing unit 715. The memory 705 temporarily stores a sensed image and also stores the position of a defect in the sensed image. The optical distance measuring unit 706 performs focusing or distance measurement of an object. The parallax calculation unit 707 calculates the parallax (phase difference of a parallax image) from the data of a plurality of images obtained by the plurality of image sensing apparatuses 702. The object recognition unit 708 recognizes objects such as a vehicle, a road, a road sign, a person and the like. Upon detecting the abnormality of the image sensing apparatus 702, the abnormality detection unit 709 notifies a main control unit 713, which serves as a control apparatus, of the abnormality.

The integrated circuit 703 may be implemented by dedicated hardware or may be implemented by a software module. The integrated circuit may also be implemented by an FPGA (Field Programmable Gate Array) or an ASIC (Application Specific Integrated Circuit) or may be implemented by a combination of these components.

The main control unit 713 comprehensively controls the operations of the image sensing system 701, vehicle sensors 710, a control unit 720, and the like. Note that a method in which the image sensing system 701, the vehicle sensors 710, and the control unit 720 each individually include a communication interface and exchange control signals via a communication network (for example, CAN standards) may be adopted without arranging the main control unit 713.

The integrated circuit 703 has a function of transmitting a control signal or a setting value to each image sensing apparatus 702 by receiving the control signal from the main control unit 713 or from its own control unit. For example, the integrated circuit 703 transmits a setting to cause a voltage switch 13 in the corresponding image sensing apparatus 702 to perform a pulse driving operation, a setting to switch the voltage switch 13 for each frame, and the like.

The image sensing system 701 is connected to the vehicle sensors 710 and can detect the traveling state of the self-vehicle such as the vehicle speed, the yaw rate, the steering angle, and the like, the external environment of the self-vehicle, and the state of other vehicles and obstacles. The vehicle sensors 710 are also distance information acquisition units that acquire distance information to a target object from a parallax image. The image sensing system 701 is also connected to a driving support control unit 711 that performs various kinds of driving support such as automatic steering, adaptive cruise control, anti-collision function, and the like. In particular, in relation to a collision determination function, the driving support control unit determines the occurrence of a collision or estimates a collision with another vehicle or an obstacle based on the detection results from the image sensing system 701 and the vehicle sensors 710. The driving support control unit executes control to avoid a collision when a collision is estimated or activates a safety apparatus at the time of a collision.

The image sensing system 701 is also connected to a warning apparatus 712 that emits a warning to the driver based on the determination result of a collision determination unit. For example, if the determination result of the collision determination unit indicates that the possibility of collision is high, the main control unit 713 performs vehicle control to avoid a collision or reduce damage by controlling a drive apparatus by applying brakes, causing the accelerator pedal to return to its original position, suppressing the engine output, and the like. The warning apparatus 712 warns the user by emitting a warning such as a sound, displaying warning information on the screen of a display unit such as a car navigation system or an instrument panel, causing the seatbelt or the steering wheel to vibrate, or the like.

In this embodiment, the image sensing system 701 captures an image of the periphery of the vehicle such as the front or the back. FIG. 6B shows an arrangement example of the image sensing system 701 in a case in which an image of the front of the vehicle is to be sensed by the image sensing system 701.

The two image sensing apparatuses 702 are arranged at the front of the transportation equipment 700. More specifically, a center line with respect to the traveling directions or the outer shape (for example, the vehicle width) of the transportation equipment 700 is set as an axis of symmetry, and the two image sensing apparatuses 702 are arranged line-symmetrically with respect to this axis of symmetry. This arrangement can further increase the determination accuracy when determining the possibility of a collision or acquiring the distance information between the transportation equipment 700 and a target object. The image sensing apparatuses 702 can be arranged so as not to obstruct the field of view of the driver when the driver is to visually identify the state outside the transportation equipment 700 from the driver's seat. The warning apparatus 712 may be arranged so as to be in the visual field of the driver.

The fault detection operation of each image sensing apparatus 702 of the image sensing system 701 will be described next with reference to FIG. 7. The fault detection of the image sensing apparatus 702 is performed in accordance with the processes of steps S810 to S880 shown in FIG. 7.

Step S810 is a step in which the startup setting of the image sensing apparatus 702 is performed. That is, settings for the operation of the image sensing apparatus 702 are transmitted from outside (for example, the main control unit 713) the image sensing system 701 or inside the image sensing system 701, and the image sensing operation and the fault detection operation of the image sensing apparatus 702 are started.

Next, in step S820, a pixel signal is obtained from each effective pixel. In step S830, an output value from a fault detection pixel that has been arranged for fault detection is obtained. This fault detection pixel includes a photoelectric conversion unit in the same manner as each effective pixel. A predetermined voltage is written into this photoelectric conversion unit. The fault detection pixel outputs a signal corresponding to this voltage which was written in the photoelectric conversion unit. Note that the order of step S820 and the S830 may be reversed.

Next, in step S840, applicability determination between the expected output value of the fault detection pixel and the actual output value of the fault detection pixel is performed.

If the expected output value and the actual output value match as a result of the applicability determination in step S840, the process advances to step S850, it is determined that the image sensing operation is being performed normally, and the process advances to step S860. In step S860, each pixel signal of the scanning target row is transmitted to the memory 705 and temporarily stored. Subsequently, the process returns to step S820, and the fault detection operation is continued.

Meanwhile, if the expected output value and the actual output value do not match as a result of the applicability determination in step S840, the process advances to step S870. In step S870, the image sensing operation is determined to be abnormal, and a warning is emitted to the main control unit 713 or the warning apparatus 712. The warning apparatus 712 causes the display unit to display a message about the detection of the abnormality. Subsequently, in step S880, the image sensing apparatus 702 is stopped, and the operation of the image sensing system 701 ends.

Note that this embodiment showed an example in which the processes of the flowchart are looped for each row. However, the processes of the flowchart may be looped every plurality of rows or the fault detection operation may be performed for each frame.

The warning emitted here in step S870 may be set so that its notification will be transmitted outside the vehicle via a wireless network.

Although this embodiment described control for avoiding a collision with another vehicle, it is also applicable to automated driving control for following another vehicle or an automated driving control for preventing the vehicle from drifting out of the lane. Furthermore, the image sensing system 701 is applicable not only to a vehicle such as an automobile but also to, for example, a traveling medium (traveling apparatus) such as a ship, an airplane, or an industrial robot. In addition, the image sensing system is applicable not only to a traveling medium but also to an equipment that uses object recognition widely such as an intelligent transportation system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-246402, filed Dec. 22, 2017, which is hereby incorporated by reference wherein in its entirety.

What is claimed is:

1. A solid-state image sensing apparatus comprising:
a plurality of pixels each including a photoelectric conversion element arranged in a semiconductor layer which has a first surface and a second surface on a side opposite to the first surface; and a wiring layer arranged below the first surface,
wherein each of the plurality of pixels includes a first reflection film arranged below the first surface, an interlayer film arranged so as to cover the second surface, a second reflection film arranged inside the interlayer film so as to cover the second surface, and a microlens which is arranged above the interlayer film in correspondence with the photoelectric conversion element,
an aperture portion is arranged in a portion, of the second reflection film, which overlaps the photoelectric conversion element in an orthographic projection with respect to the second surface,
the photoelectric conversion element includes a charge accumulation portion configured to accumulate charges generated in accordance with incident light,
an area of the aperture portion is smaller than an area of the photoelectric conversion element in the orthographic projection with respect to the second surface, and
each of the plurality of pixels further includes a deflecting portion configured to deflect light between the aperture portion and the second surface.

2. The apparatus according to claim 1, wherein the deflecting portion includes a high refractive index film which is arranged so as to cover the second surface and is made of a material having a higher refractive index than the interlayer film, and the high refractive index film has a cavity in a region that overlaps the aperture portion in the orthographic projection with respect to the second surface.

3. The apparatus according to claim 2, wherein the solid-state image sensing apparatus further comprises, in a portion between pixels which are adjacent to each other among the plurality of pixels, an element isolation portion in which a dielectric material is buried in the semiconductor layer, and the high refractive index film has a cavity in a region that overlaps the element isolation portion in the orthographic projection with respect to the second surface.

4. The apparatus according to claim 1, wherein the deflecting portion includes, in a region that overlaps the aperture portion in the orthographic projection with respect to the second surface, a diffraction grating made of a material having a high refractive index than a material of the interlayer film.

5. The apparatus according to claim 4, wherein the solid-state image sensing apparatus further comprises, in a portion between pixels which are adjacent to each other among the plurality of pixels, an element isolation portion in which a dielectric material is buried in the semiconductor layer.

6. The apparatus according to claim 5, wherein the deflecting portion is not arranged in a region that overlaps the element isolation portion in the orthographic projection with respect to the second surface.

7. The apparatus according to claim 3, wherein a first-conductivity type layer which has a conductivity type opposite to the charge accumulation portion is arranged in the second surface of the semiconductor layer, and the dielectric material is buried from the first surface to the first-conductivity type layer.

8. The apparatus according to claim 5, wherein a first-conductivity type layer which has a conductivity type opposite to the charge accumulation portion is arranged in the second surface of the semiconductor layer, and the dielectric material is buried from the first surface to the first-conductivity type layer.

9. The apparatus according to claim 6, wherein a first-conductivity type layer which has a conductivity type opposite to the charge accumulation portion is arranged in the second surface of the semiconductor layer, and the dielectric material is buried from the first surface to the first-conductivity type layer.

10. The apparatus according to claim 1, wherein the first reflection film has a stacked layer structure including a first layer which is in contact with the first surface and a second layer which is in contact with a surface on a side opposite to a surface, of the first layer, which is in contact with the first surface, and the second layer has a higher refractive index than the first layer.

11. The apparatus according to claim 2, wherein the first reflection film has a stacked layer structure including a first layer which is in contact with the first surface and a second layer which is in contact with a surface on a side opposite to a surface, of the first layer, which is in contact with the first surface, and the second layer has a higher refractive index than the first layer.

12. The apparatus according to claim 4, wherein the first reflection film has a stacked layer structure including a first layer which is in contact with the first surface and a second layer which is in contact with a surface on a side opposite to a surface, of the first layer, which is in contact with the first surface, and the second layer has a higher refractive index than the first layer.

13. The apparatus according to claim 7, wherein the first reflection film has a stacked layer structure including a first layer which is in contact with the first surface and a second layer which is in contact with a surface on a side opposite to a surface, of the first layer, which is in contact with the first surface, and the second layer has a higher refractive index than the first layer.

14. The apparatus according to claim 9, wherein the first reflection film has a stacked layer structure including a first layer which is in contact with the first surface and a second layer which is in contact with a surface on a side opposite to a surface, of the first layer, which is in contact with the first surface, and the second layer has a higher refractive index than the first layer.

15. The apparatus according to claim 10, wherein the first layer contains silicon oxide, and the second layer contains silicon nitride or polysilicon.

16. The apparatus according to claim 1, wherein the interlayer film contains silicon oxide, and the deflecting portion contains silicon nitride or polysilicon.

17. The apparatus according to claim 15, wherein the interlayer film contains silicon oxide, and the deflecting portion contains silicon nitride or polysilicon.

18. The apparatus according to claim 1, wherein an anti-reflection layer is arranged between the second surface and the interlayer film.

19. An electronic device comprising:
a solid-state image sensing apparatus defined in claim 1; and
a processing apparatus configured to process a signal output from the solid-state image sensing apparatus.

20. A transportation equipment that includes a drive apparatus, comprising:
a solid-state image sensing apparatus defined in claim 1; and
a control apparatus configured to control the drive apparatus based on information acquired by the solid-state image sensing apparatus.

* * * * *